United States Patent
Swaminathan et al.

(10) Patent No.: US 8,377,550 B2
(45) Date of Patent: Feb. 19, 2013

(54) FLIP CHIP PACKAGE CONTAINING NOVEL UNDERFILL MATERIALS

(75) Inventors: Rajasekaran Swaminathan, Chandler, AZ (US); Hong Dong, Chandler, AZ (US); Sandeep Razdan, Chandler, AZ (US); Nisha Ananthakrisnan, Chandler, AZ (US); Rahul Manepalli, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 448 days.

(21) Appl. No.: 12/655,366

(22) Filed: Dec. 29, 2009

(65) Prior Publication Data

US 2011/0159228 A1    Jun. 30, 2011

(51) Int. Cl.
*B32B 27/20* (2006.01)
*B32B 15/092* (2006.01)

(52) U.S. Cl. .......... 428/331; 428/418; 428/457
(58) Field of Classification Search .......... None
See application file for complete search history.

(56) References Cited

U.S. PATENT DOCUMENTS

| | | | |
|---|---|---|---|
| 6,274,650 B1 * | 8/2001 | Cui ............... | 523/457 |
| 2005/0129956 A1 * | 6/2005 | Rubinsztajn et al. ......... | 428/413 |
| 2012/0172495 A1 * | 7/2012 | Czubarow et al. ............ | 523/456 |

* cited by examiner

*Primary Examiner* — Ramsey Zacharia
(74) *Attorney, Agent, or Firm* — Winkle, PLLC

(57) ABSTRACT

Methods and associated structures of forming underfill material are described. Those methods may include applying an underfill to an interconnect structure comprising residue from a no clean flux, wherein the underfill comprises at least one of a functionalized nanofiller and a micron-sized filler.

20 Claims, 6 Drawing Sheets

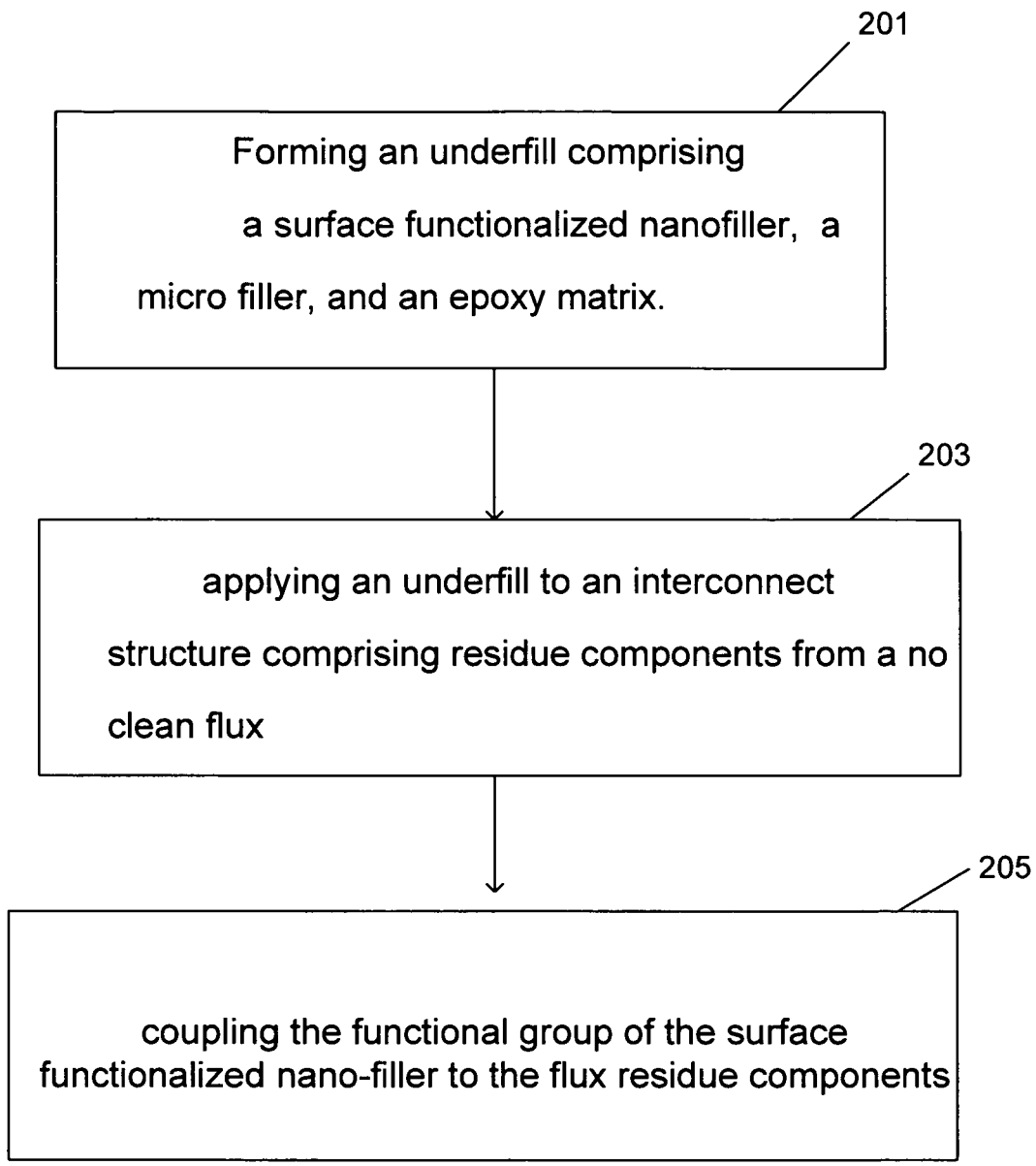
FIG, 2

FLIP CHIP PACKAGE CONTAINING NOVEL UNDERFILL MATERIALS

BACKGROUND OF THE INVENTION

No clean flux is being considered as an alternate fluxing technology for the conventional C4 based flip chip packaging technology in order to reduce the increased levels of residue that is sometimes left behind between the interconnect structures of a flip chip package, such as residue left between first level interconnect (FLI) joints, for example. The remaining residue between the joints may be related to inefficient deflux processes, for example.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 2 represents a flowchart according to an embodiment of the present invention.

DETAILED DESCRIPTION OF THE PRESENT INVENTION

Figure 1A:
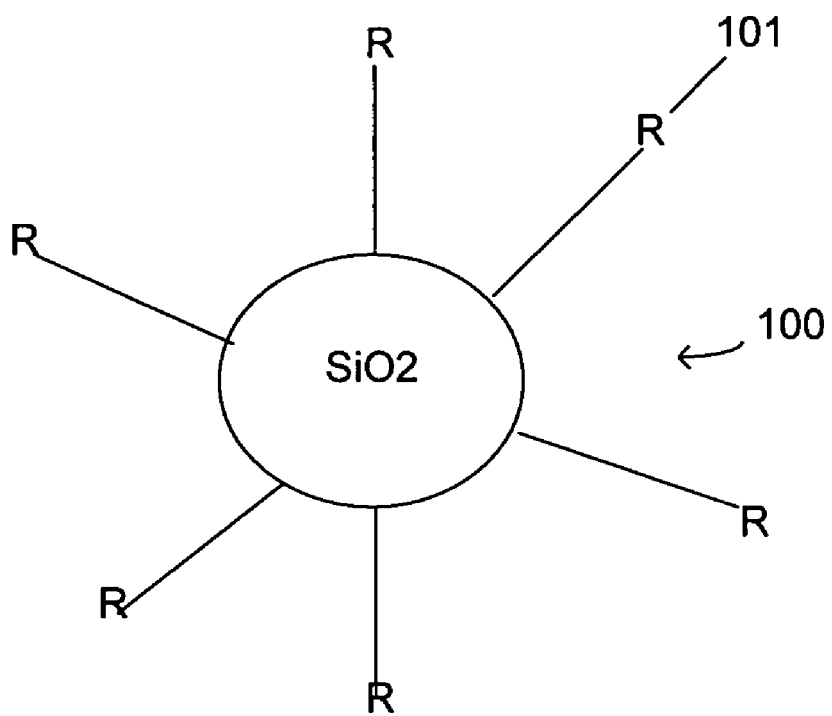
FIGS. 1a-1d represent structures according to an embodiment of the present invention.
Figure 1B:
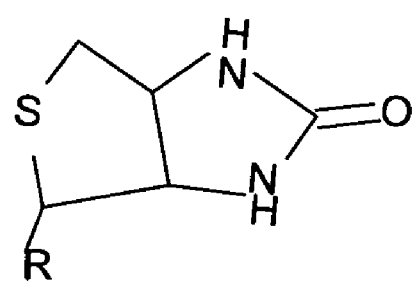
Figure 1C:
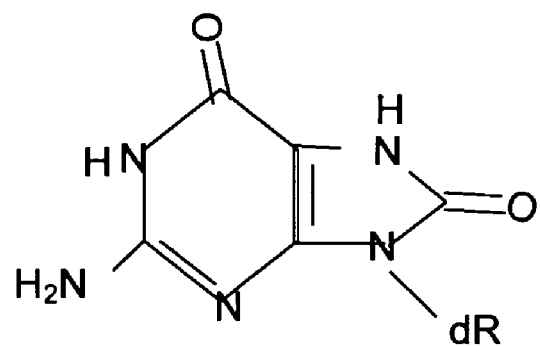
Figure 1D:
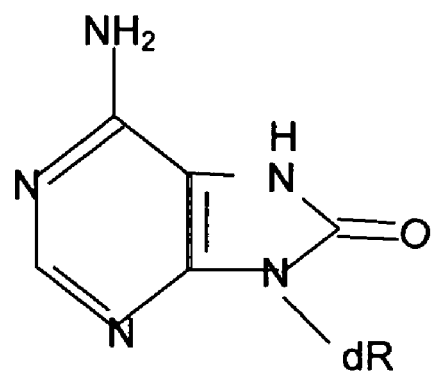

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and using an underfill material in packaging structures are described. Those methods may include applying an underfill to an interconnect structure comprising residue from a no clean flux, wherein the underfill comprises at least one (or a combination) of a surface functionalized nanofiller and a micron-sized filler. Methods of the present invention may increase residue void reduction in microelectronic packages.

FIGS. 1a-1d illustrates embodiments of methods of forming microelectronic structures and materials, such as underfill materials. FIG. 1a illustrates a functionalized nanoparticle 100. The functionalized nanoparticle may comprise a silica functionalized nanoparticle in an embodiment, and may comprise a surface functionalized nanofiller 100. An R group 101 may be attached to the nanoparticle 100. The R group may comprise the group —O—Si—X, where X may comprise at least one of a biotin group (FIG. 1b), an 8-oxoguanosine group (FIG. 1c), an 8-oxoadenosine group (FIG. 1d) and an ureido group by illustration and not limitation.

In some embodiments the functionalized nano filler 100 may include but is not limited to silica and/or alumina nanoparticle 100, wherein the surface chemistry of the nanoparticle 100 may be functionalized, and may be functionalized by the functional group R 101. In some embodiments, the functional group R 101 may comprise materials which are capable of forming complexes with residue from a no clean flux, such as a high activity, no-clean flux.

FIG. 2 depicts a flow chart of an embodiment wherein an underfill may be formed comprising the surface functionalized nano filler, a micro filler, and an epoxy matrix at step 201 (FIG. 2). The functional group of the functionalized nano filler may comprise an amine containing compound in an embodiment. The underfill may further comprise epoxy and hardeners. In an embodiment, the micro filler may be functionalized with functional groups as well, in a like manner as the nano filler. In another embodiment, the underfill may comprise little to no micro fillers. The nano and micro fillers may be dispersed uniformly within the underfill matrix, and may be compatible with the flux residue (reacting with the flux residue) to reduce void creation in a device structure utilizing the underfill, such as in a flip chip package. In an embodiment, the underfill may comprise less than about 70 percent surface functionalized nano filler and microfiler, and may comprise less than about 20 percent surface functionalized nano filler. In an embodiment, the underfill may comprise between about 10 to about 20 percent surface functionalized nano filler.

An underfill may be applied to an interconnect structure comprising residue components from a no clean flux at step 203. Prior art underfill material are not compatible with the flux residue left behind, especially with a no-clean flux, which leads to underfill voiding and related reliability risks in packaged devices. The surface functionalized nano fillers of the underfill according to the embodiments of the invention provide for increased surface area in a given volume space. This further provides for improved interfacial interaction between the surface functionalized nano filler and the no clean flux residue, in the form of a reaction and/or a secondary chemical bond between them. At step 205, the functional group of the surface functionalized nano-filler may be coupled to the flux residue components from the no clean flux. The surface functionalization of the nano-fillers can be tuned to chemically/physically attached to the no clean flux residue components by forming a residue-underfill complex that becomes a part of the underfill. In an embodiment, the no clean flux residue comprises at least one of a chemical bond and a physical compatibility to a functional group of the surface functionalized nanofiller.

Figure 3A:
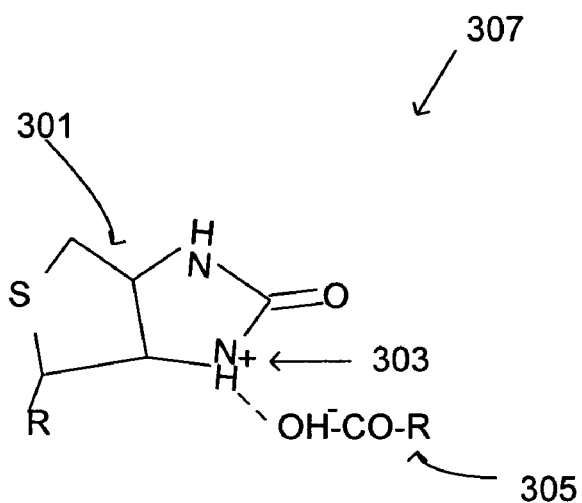
FIGS. 3a-3b represent structures according to an embodiment of the present invention.
Figure 3B:
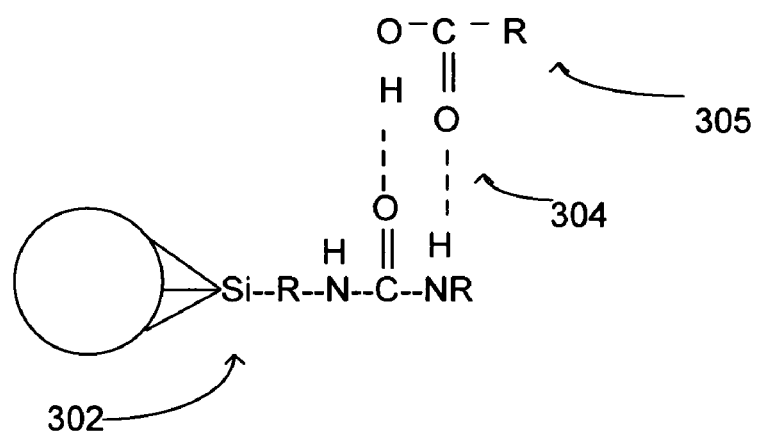

For example, in an embodiment, an NH group 303 of a functional group 301 of the nano/micro filler may couple to an acid residue (R—CO—OH) 305 of the no clean flux residue to form the complex 307 shown in FIG. 3a. In an other embodiment, an interaction/physical bond 304 between an acid 305 from the no clean flux residue and a Ureido coated nanofiller 302 (as depicted in FIG. 3b) may reduce an acid catalytic effect on surrounding underfill gelling and curing, thus leading to residue void reduction.

Figure 4:
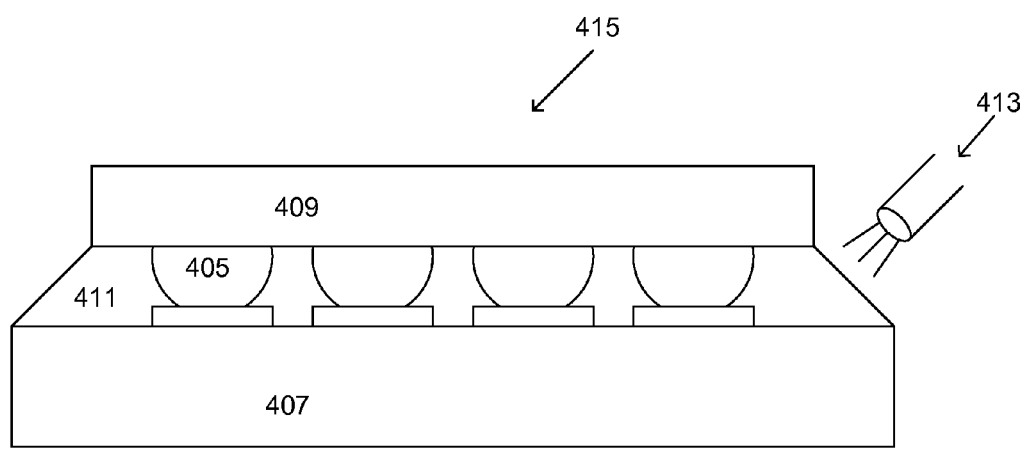
FIG. 4 represents a structure according to an embodiment of the present invention.

In another embodiment, an underfill 411 may be applied/dispensed 413 around a plurality of interconnect structures 405, such as ball grid array (BGA structures for example (FIG. 4). The interconnect structures 405 may be disposed on a chip 409, which may comprise a flip chip 409 in an embodiment. The interconnect structures of the flip chip 409 may be connected to a substrate 407. The structure 415 may comprise a portion of a microelectronic package, such as a flip chip package, for example.

In one embodiment, the flip chip package 415 may comprise no clean flux residue from a previous process step. The functional group of the surface functionalized nano-filler may be tuned/selected to chemically/physically attach and or react/interact with the flux residue components by forming a residue-underfill complex that becomes part of the underfill 411. In an embodiment, the functional group may comprise at least one of a biotin, an 8-oxoguanosine, an 8-oxoadenosine and an ureido functional group.

Figure 5:
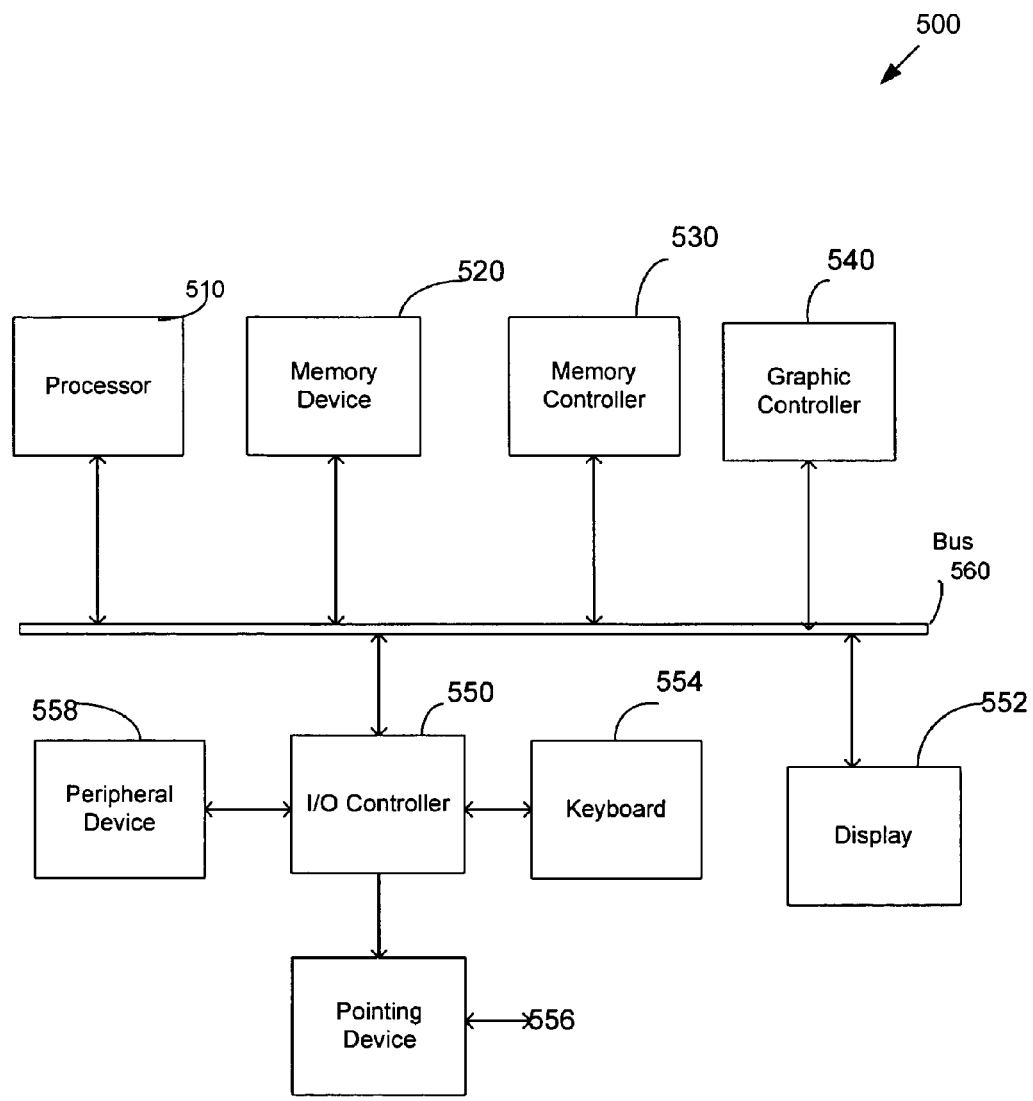
FIG. 5 represents a system according to an embodiment of the present invention.

FIG. 5 shows a computer system according to an embodiment of the invention. System 500 includes a processor 510, a memory device 520, a memory controller 530, a graphics controller 540, an input and output (I/O) controller 550, a display 552, a keyboard 554, a pointing device 556, and a peripheral device 558, all of which may be communicatively coupled to each other through a bus 560, in some embodiments. Processor 510 may be a general purpose processor or an application specific integrated circuit (ASIC). I/O controller 550 may include a communication module for wired or wireless communication. Memory device 520 may be a dynamic random access memory (DRAM) device, a static random access memory (SRAM) device, a flash memory device, or a combination of these memory devices. Thus, in some embodiments, memory device 520 in system 500 does not have to include a DRAM device.

One or more of the components shown in system 500 may be included in and/or may include one or more integrated circuit packages, such as the package structure 415 of FIG. 4 for example. For example, processor 510, or memory device 520, or at least a portion of I/O controller 550, or a combination of these components may be included in an integrated circuit package that includes at least one embodiment of a structure described in the various embodiments.

These elements perform their conventional functions well known in the art. In particular, memory device 520 may be used in some cases to provide long-term storage for the executable instructions for a method for forming packaged structures in accordance with embodiments of the present invention, and in other embodiments may be used to store on a shorter term basis the executable instructions of a method for forming package structures in accordance with embodiments of the present invention during execution by processor 510. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 520 may supply the processor 510 with the executable instructions for execution.

System 500 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the present invention include but are not limited to enabling an underfill formulation containing surface functionalized nano-fillers and their ability to compatiblize/react with the residue left behind by high activity no-clean fluxes. The novel surface functionalization can also be applied to micro-sized fillers to ensure this compatibility with the flux residue. Additionally, flip chip packages with high activity no clean fluxes benefit from the use of the underfill formulation of the various embodiments herein.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices, such as a microelectronic packages, are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
applying an underfill to an interconnect structure comprising residue from a no clean flux, wherein the underfill comprises a functionalized nano filler and a micro filler, and wherein the functionalized nano filler comprises a surface functionalized silica nanoparticle with an attached functional group of at least one of a biotin, a 8-oxoguanosine, a 8-oxoadenosine and a ureido functional group.

2. The method of claim 1 further comprising wherein the nano filler comprises a size below about 50 nm.

3. The method of claim 1 further comprising wherein a NH portion of the functional group chemically bonds with an acidic portion of the no clean flux residue.

4. The method of claim 1 wherein an interaction between an acid from the no clean flux residue and an ureido functional group coated on the surface functionalized nanofiller reduces an acid catalytic effect on underfill gelling and curing.

5. The method of claim 4 wherein the interaction decreases residue voids.

6. The method of claim 1 wherein the functional group of the surface functionalized nano-filler is tuned to chemically attach to the flux residue components by forming a residue underfill complex that becomes part of the underfill.

7. The method of claim 1 further comprising wherein the underfill comprises less than about 70 percent of microfillers and funtionalized nanofillers.

8. The method of claim 1 further comprising wherein the underfill comprises less than about 20 percent nanofillers.

9. A structure comprising:
an interconnect structure comprising a no clean flux residue; and
an underfill comprising a surface functionalized nanofiller and a micro filler, wherein the no clean flux residue comprises at least one of a chemical bond and a physical compatibility to a functional group of the surface functionalized nanofiller and wherein functional group comprises at least one of biotin, 8-oxoguanosine, 8-oxoadenosine and ureido.

10. The structure of claim 9 wherein the underfill material comprises an epoxy underfill and wherein the functionalized nanoparticles are coupled with the no clean flux residue.

11. The structure of claim 9 wherein the no clean flux residue comprises an acid residue.

12. The structure of claim 9 wherein the microfiller is surface functionalized and comprises a complex with the no clean flux reside.

13. The structure of claim 9 wherein the surface functionalized nanofiller comprises a size of less than about 50 nm, and comprises a percentage of less than about 20 percent of the underfill.

14. A structure comprising:
   an interconnect structure comprising a portion of a microelectronic package;
   an underfill around the interconnect structure, wherein the underfill comprises a functionalized nanofiller and a micro filler, wherein the functionalized nano filler comprises a functional group comprising at least one of a biotin, a 8-oxoguanosine, a 8-oxoadenosine and a ureido functional group.

15. The structure of claim 14 wherein the functionalized nanofiller comprises a surface functional group coupled with a no clean flux residue.

16. The structure of claim 15 wherein the functionalized nanofiller comprises an amine group of a functional group of the nano filler coupled with a hydroxyl group of the no clean flux residue.

17. The structure of claim 14 wherein the interconnect structure comprises a first level interconnect of the microelectronic package structure.

18. The structure of claim 14 wherein the microfiller comprises a surface functional group in complex with a no clean flux reside.

19. The structure of claim 14 further comprising a system comprising:
   a bus communicatively coupled to the structure; and
   a DRAM communicatively coupled to the bus.

20. The structure of claim 14 wherein the nanofiller and microfiller are dispersed uniformly in the underfill.

* * * * *